(12) United States Patent
Thapliyal et al.

(10) Patent No.: US 10,923,161 B2
(45) Date of Patent: Feb. 16, 2021

(54) BITCELL WORDLINE STRAPPING CIRCUITRY

(71) Applicant: Arm Limited, Cambridge (GB)

(72) Inventors: Sumant Kumar Thapliyal, Bangalore (IN); Sumeet Sawant, Bangalore (IN); Avinash Merugu, Bangalore (IN); Deeksha Anandani, Bangalore (IN); Veera Raghavulu Marella, Bangalore (IN); Srinath Gopinath, Bangalore (IN); Abdullah Shahid, Bangalore (IN)

(73) Assignee: Arm Limited, Cambridge (GB)

( * ) Notice: Subject to any disclaimer, the term of this patent is extended or adjusted under 35 U.S.C. 154(b) by 102 days.

(21) Appl. No.: 15/874,444

(22) Filed: Jan. 18, 2018

(65) Prior Publication Data
US 2019/0221239 A1   Jul. 18, 2019

(51) Int. Cl.
| | | |
|---|---|---|
| *G11C 5/06* | (2006.01) | |
| *G11C 8/14* | (2006.01) | |
| *G11C 7/18* | (2006.01) | |
| *G11C 17/12* | (2006.01) | |
| *H01L 27/02* | (2006.01) | |
| *H01L 27/112* | (2006.01) | |

(52) U.S. Cl.
CPC .............. *G11C 5/06* (2013.01); *G11C 7/18* (2013.01); *G11C 8/14* (2013.01); *G11C 17/12* (2013.01); *G11C 5/063* (2013.01); *H01L 27/0207* (2013.01); *H01L 27/11226* (2013.01)

(58) Field of Classification Search
CPC .................................... G11C 5/06; G11C 7/18
USPC .......................................................... 365/63
See application file for complete search history.

(56) References Cited

U.S. PATENT DOCUMENTS

| | | | | |
|---|---|---|---|---|
| 6,041,008 A | * | 3/2000 | Marr ...................... | G11C 11/005 365/154 |
| 6,636,434 B2 | * | 10/2003 | Poullet ................ | G11C 11/5692 365/103 |
| 9,147,495 B2 | * | 9/2015 | Roy ....................... | G11C 17/146 |
| 2002/0091894 A1 | * | 7/2002 | Garg .................... | G11C 11/5692 711/103 |
| 2005/0226068 A1 | * | 10/2005 | Brandon ............... | H01L 27/112 365/203 |
| 2010/0046267 A1 | * | 2/2010 | Yan ..................... | G11C 13/0028 365/51 |
| 2013/0170275 A1 | * | 7/2013 | Kumar ................ | H01L 27/1104 365/63 |

* cited by examiner

*Primary Examiner* — Muna A Techane
(74) *Attorney, Agent, or Firm* — Pramudji Law Group PLLC; Ari Pramudji

(57) ABSTRACT

Various implementations described herein are directed to an integrated circuit. The integrated circuit may include a bitcell and multiple straps including a first strap, a second strap, and a third strap. The first strap may couple the bitcell to ground. The second strap may couple the bitcell to a bitline. The third strap may couple the bitcell to a wordline within a boundary of the bitcell.

20 Claims, 8 Drawing Sheets

BITCELL WORDLINE STRAPPING CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, in physical design, performance of bitcells at advanced process nodes may be compromised by requirements of standard cell libraries. For instance, in the case of standard cell libraries for bitcells, poly-silicon resistance may be higher than metal resistance, and hence, a metal wire may be ran in parallel to a wordline (which is in poly-silicon) and externally tapped after a certain interval. In conventional technology, due to standard bitcell limitations, an extra bitcell is typically used to tap the metal wire with the poly-silicon. This tap-strapping may be typically achieved after every thirty-two (32) columns. Thus, in these instances, the tap-strapping frequency may be increased, and as such, the area is increased with the increase in tapping frequency. Hence, with this methodology, area increases drastically for instances involving wide bitcell arrays, which is not desirable in modern miniaturized circuitry.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to bitcell wordline strapping circuitry for resistance and area reduction in physical design. For instance, various implementations described herein are directed to a standard cell layout design technique, which may assist with implementing a resistance and/or area efficient bitcell structure in high-density standard cell architectures. This design assist technique may reduce resistance and/or an area of an array of bitcells in high or ultra-high density standard cell libraries. In some instances, the bitcell wordline strapping circuitry may refer to built-in ROM bitcell (i.e., read-only memory bitcell) wordline strapping to achieve optimum PPA (power, performance, and area) compared with conventional ROM. As such, various implementations described herein may refer to a ROM PPA improvement that utilizes wordline strapping within a ROM bitcell itself.

Various implementations of bitcell wordline strapping circuitry in physical design will now be described in greater detail herein with reference to FIGS. 1-5.

Figure 1A:
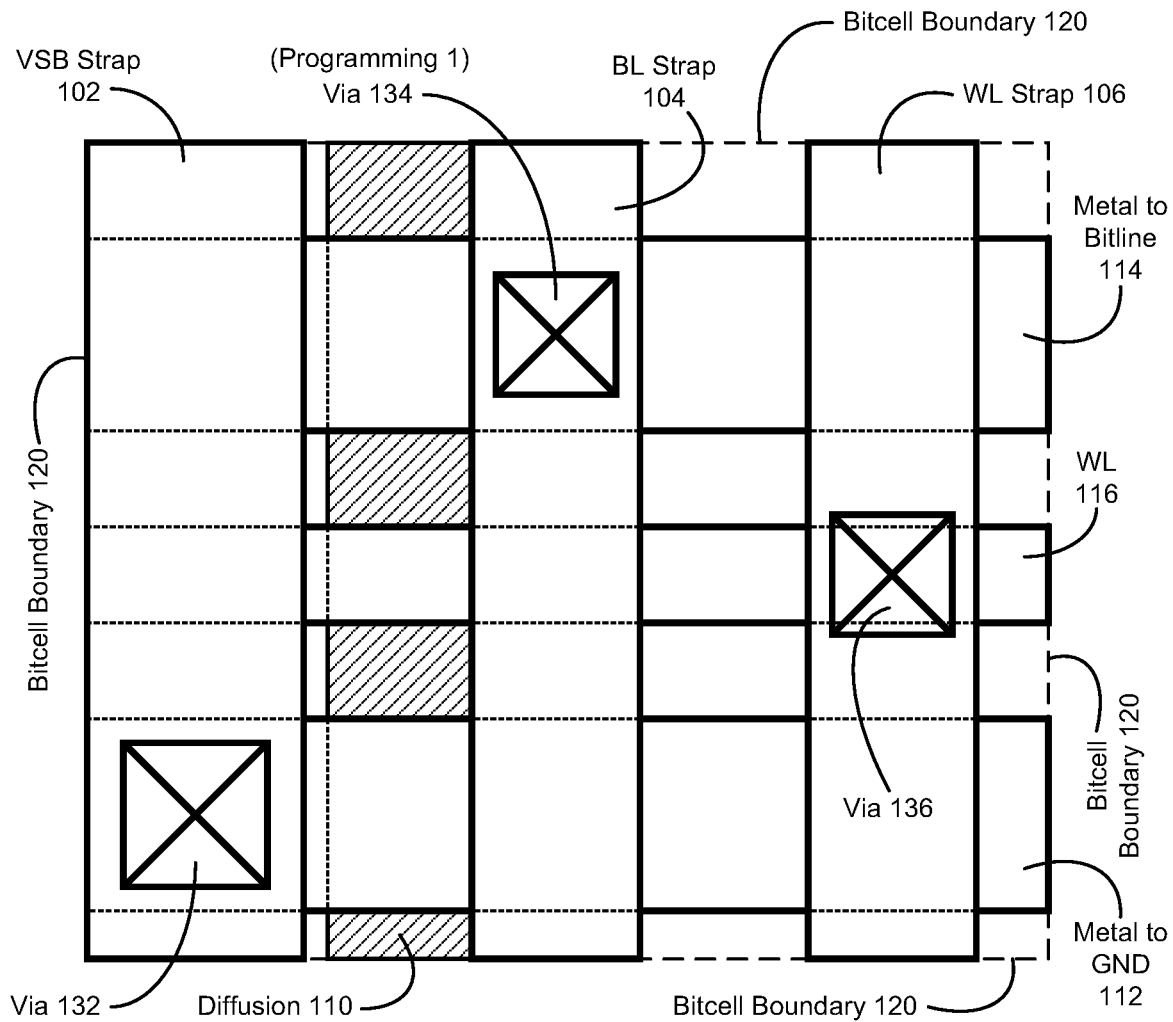
FIGS. 1A-1D illustrate diagrams of bitcell wordline strapping circuitry in physical design in accordance with various implementations described herein.
Figure 1B:
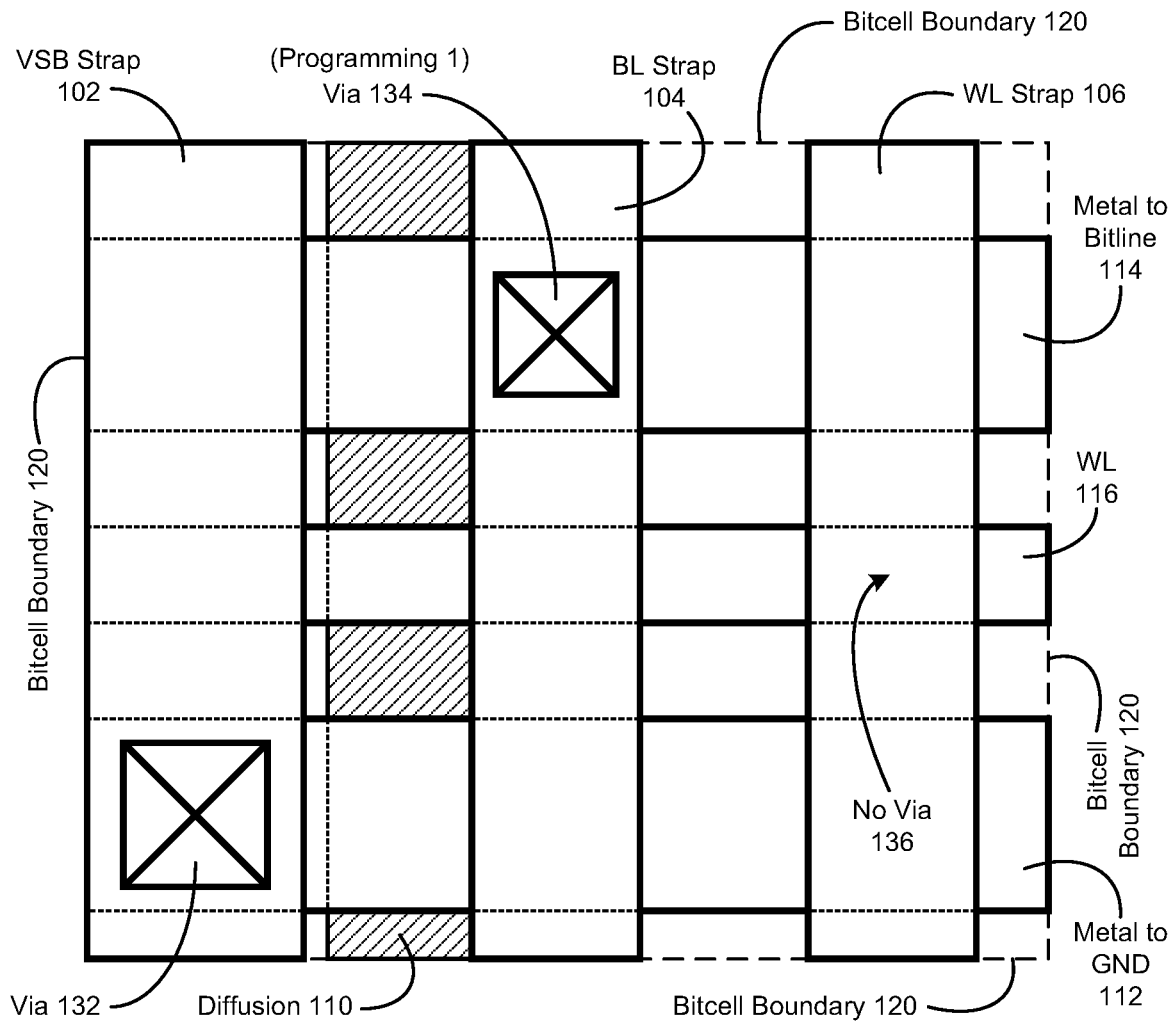
Figure 1C:
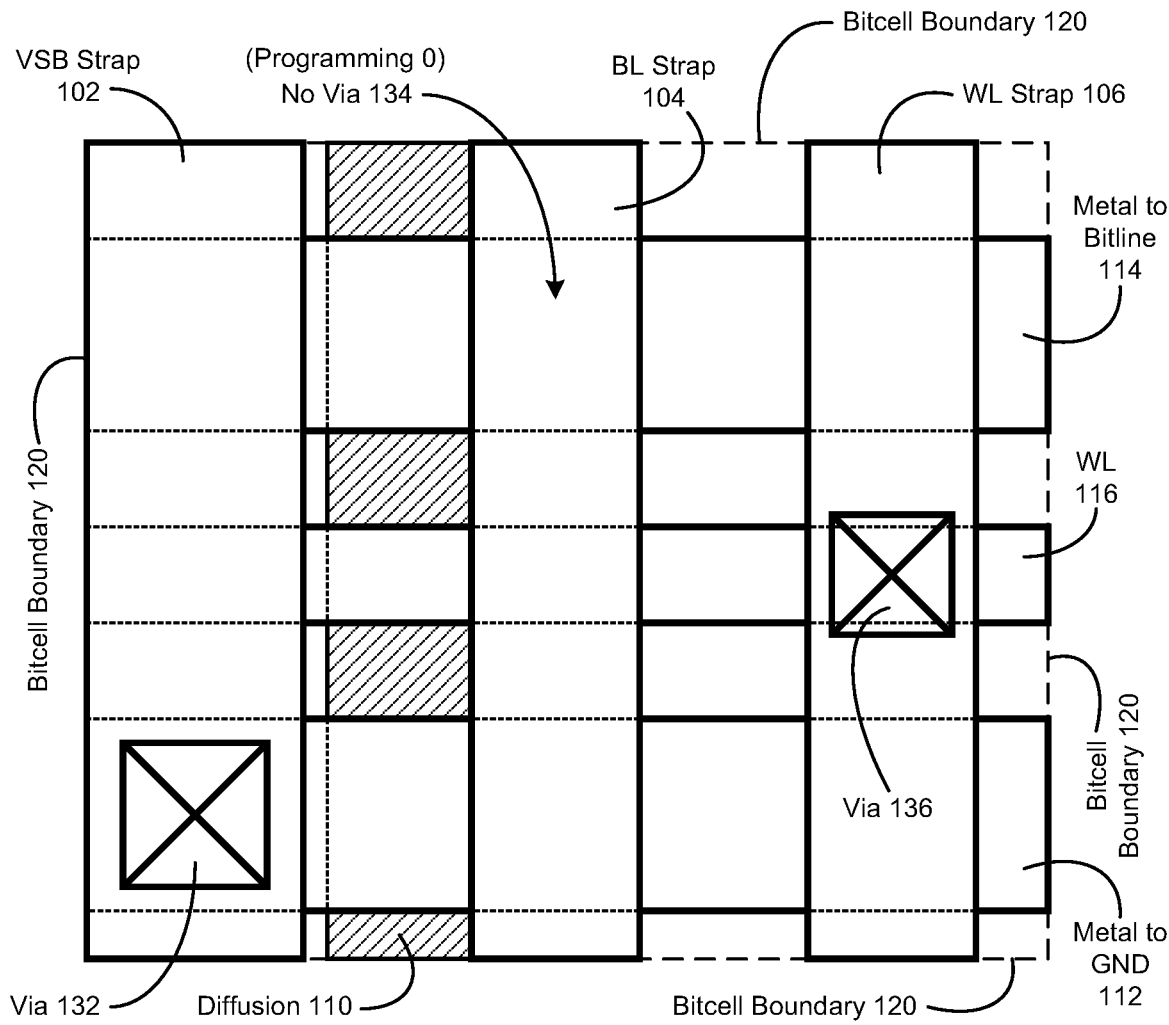
Figure 1D:
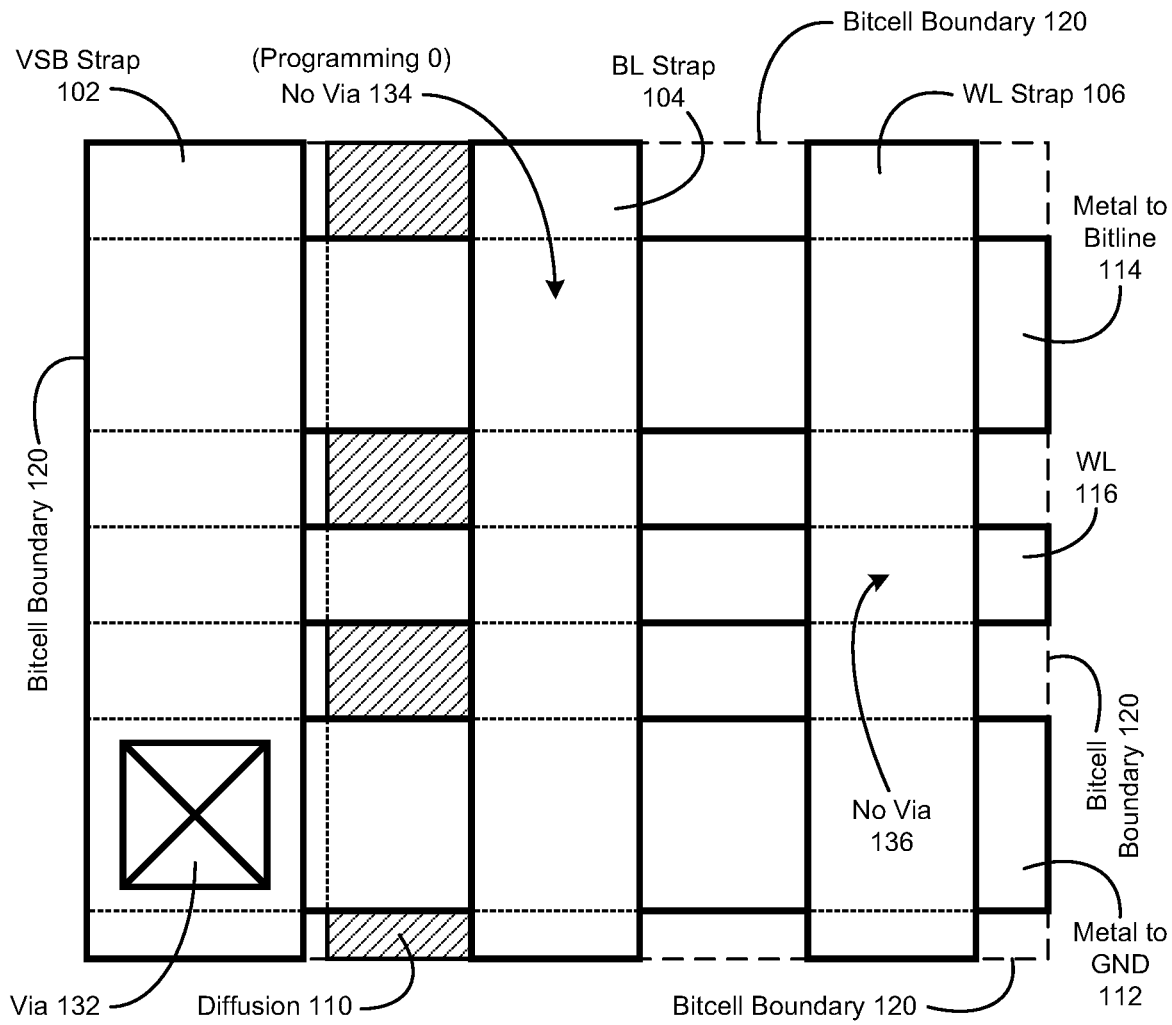

FIGS. 1A-1D illustrate diagrams of bitcell wordline strapping circuitry 100 in physical design in accordance with various implementations described herein. Further, as shown and described herein, FIGS. 1B-1D illustrate variations of the bitcell wordline strapping circuitry 100 as described in reference to FIG. 1A. In this instance, various components shown and described in reference to FIG. 1A may be applied similarly to the implementations shown and described in reference to FIGS. 1B-1D.

As shown in FIG. 1A, the bitcell wordline strapping circuitry 100 may include a first bitcell 100A having multiple internal components within a boundary 120, e.g., as shown outlined with a dashed line. In some cases, the bitcell 100A may be implemented as a read-only memory (ROM) bitcell. Further, the first bitcell 100A may include at least one diffusion region 110, which is described in greater detail herein below.

The first bitcell 100A may include a first strap 102 (e.g., ground strap) that may be used to couple the first bitcell 100A to ground (VSB, VSS, GND). As such, in some cases, the first strap 102 may be implemented as a ground strap that couples the bitcell 100A to ground (VSB, VSS, GND) with a first via 132 that is coupled to a first metal wire 112, which is coupled to ground (VSB, VSS, GND). The first strap (or ground strap) may be disposed within the boundary of the first bitcell 100A. In some cases, the diffusion region 110 may be disposed adjacent to the first strap 102.

The first bitcell 100A may include a second strap 104 (e.g., bitline strap) that may be used to couple the first bitcell 100A to a bitline BL. As such, in some cases, the second strap 104 may be implemented as a bitline strap that couples the bitcell 100A to the bitline BL with a second via 134 that is coupled to a second metal wire 114, which is coupled to the bitline BL. The second strap (or bitline strap) may be disposed within the boundary of the first bitcell 100A. In some instances, coupling the second strap 104 to the bitline BL may program the bitcell 100A to a logical state of one (1), and further, not coupling the second strap 104 to the bitline BL may program the bitcell 100A to a logical state of zero (0). In some cases, the diffusion region 110 may extend underneath the second strap 104 by a width thereof, and as such, the diffusion region 110 may have a width that is at least greater than the width of the second strap 104.

The first bitcell 100A may include a third strap 106 (e.g., wordline strap) that may be used to couple the first bitcell 100A to a wordline WL within the boundary 120 of the first bitcell 100A. As such, in some cases, the third strap 106 may be implemented as a wordline strap that couples the bitcell 100A to the wordline WL with a third via 136 that is coupled to a third metal wire 116, which is coupled to the wordline WL.

Advantageous features associated with implementing the bitcell wordline strapping circuitry 100 (including the bitcell 100A) include scenarios wherein resistance of the bitcell may be reduced due to using the third strap 106 to couple the bitcell 100A to the wordline WL within the boundary 120 of the bitcell 100A. Accordingly, the bitcell wordline strapping circuitry 100 (including the bitcell 100A) may provide an increase in performance (e.g., speed), due to this technique of coupling the bitcell 100A to the wordline WL within the boundary 120 of the bitcell 100A, whereby the resistance is reduced. As a result, the total RC (resistance-capacitance) product of the bitcell 100A may thus be reduced. In some instances, power is not affected, and coupling may be referred to as connecting or tapping. Further, in some scenarios, as described in greater detail herein below, a decrease in area may also be achieved, wherein the bitcell 100A provides a reduction in area because an extra bitcell is no longer needed in an array of bitcells to couple a row of bitcells to the wordline WL.

In some implementations, the first bitcell 100A may be embodied as a single bitcell that is programmed as logic one (1) with the WL strap 106 coupled to the wordline WL with the third via 136. For instance, in FIG. 1A, the second via 134 exists, and the inclusion of the second via 134 assists with programming the first bitcell 100A as logic one (1). Further, in FIG. 1A, the third via 136 exists, and the third via 136 is disposed and coupled to the wordline WL.

As shown in FIG. 1B, the bitcell wordline strapping circuitry 100 may include a second bitcell 100B having multiple internal components disposed within the boundary 120, e.g., as shown outlined with a dashed line. In some cases, the second bitcell 100B may be embodied as a single bitcell that is programmed as logic one (1) without the WL strap 106 coupled to the wordline WL with the third via 136. For instance, in FIG. 1B, the second via 134 exists, and the inclusion of the second via 134 assists with programming the second bitcell 100B as logic one (1). Further, in FIG. 1B, no third via 136 exists, i.e., the third via 136 is not disposed and not coupled to the wordline WL in a manner as shown in FIG. 1A.

As shown in FIG. 1C, the bitcell wordline strapping circuitry 100 may include a third bitcell 100C having multiple internal components disposed within the boundary 120, e.g., as shown outlined with a dashed line. In some cases, the third bitcell 100C may be embodied as a single bitcell that is programmed as logic zero (0) with the WL strap 106 coupled to the wordline WL with the third via 136. In FIG. 1C, no second via 134 exists, i.e., the second via 134 is not disposed and/or coupled in a manner as shown in FIG. 1A. In this instance, the absence of the second via 134 assists with programming the third bitcell 100C as logic zero (0). Further, in FIG. 1C, the third via 136 exists, and the third via 136 is disposed and coupled to the wordline WL in a manner as shown in FIG. 1A.

As shown in FIG. 1D, the bitcell wordline strapping circuitry 100 may include a fourth bitcell 100D having multiple internal components disposed within the boundary 120, e.g., as shown outlined with a dashed line. In some implementations, the fourth bitcell 100D may be embodied as a single bitcell that is programmed as logic zero (0) without the WL strap 106 coupled to the wordline WL with the third via 136. In FIG. 1D, no second via 134 exists, i.e., the second via 134 is not disposed and/or coupled in a manner as shown in FIG. 1A. In this instance, the absence of the second via 134 assists with programming the fourth bitcell 100D as logic zero (0). Further, in FIG. 1D, no third via 136 exists, i.e., the third via 136 is not disposed and/or coupled in a manner as shown in FIG. 1A.

Figure 2:
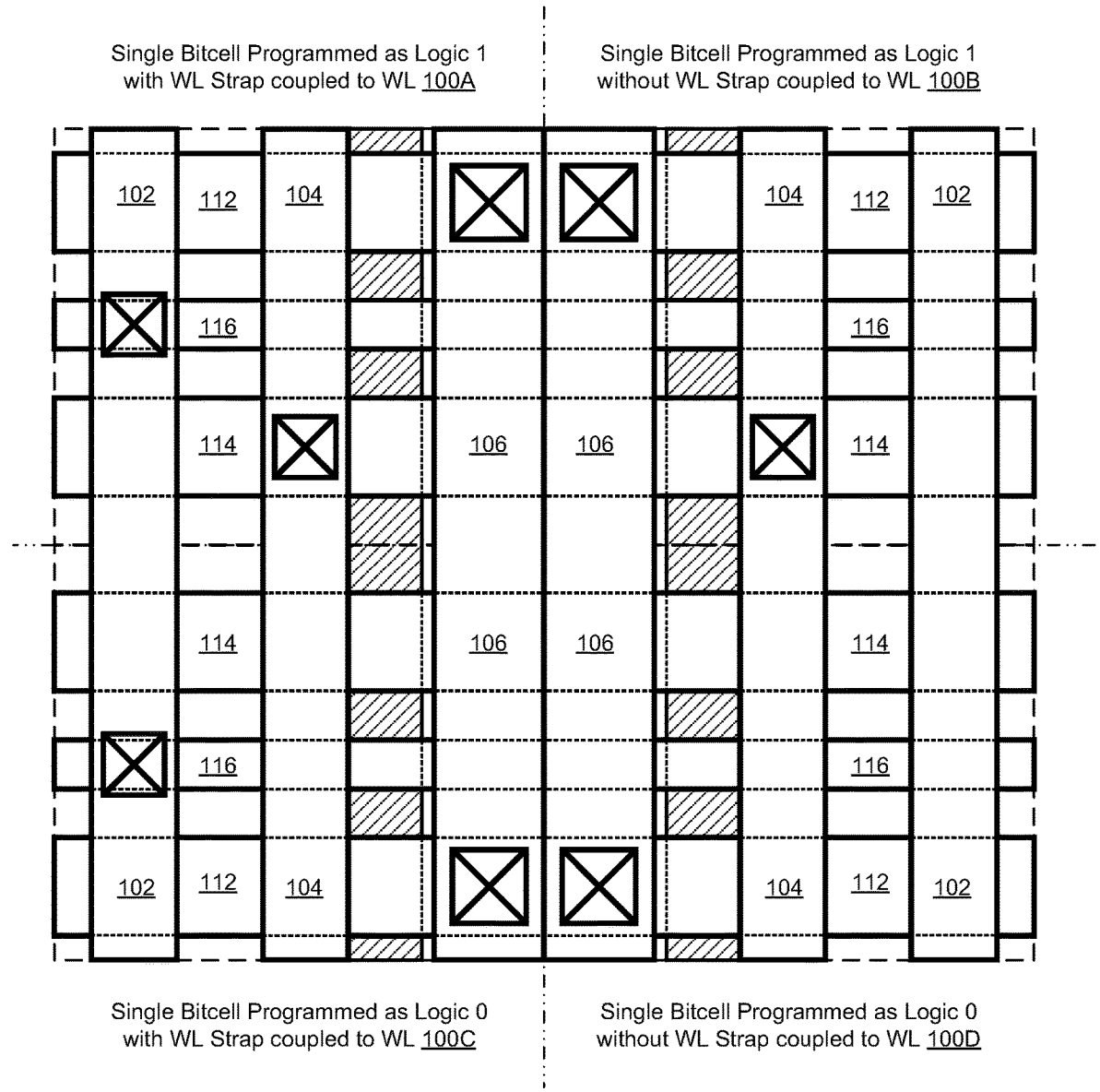
FIG. 2 illustrates a diagram of an array of bitcells in physical design in accordance with various implementations described herein.

FIG. 2 illustrates a diagram of an array of bitcells 200 in physical design in accordance with various implementations described herein.

As shown in FIG. 2, the array of bitcells 200 may include four (4) bitcells in a quadrant arrangement. The array of bitcells 200 may include the first bitcell 100A, which may be embodied as a single bitcell that is programmed as logic one (1) with the WL strap 106 coupled to the wordline WL with the third via 136. The array of bitcells 200 may further include the second bitcell 100B, which may be embodied as a single bitcell that is programmed as logic one (1) without the WL strap 106 coupled to the wordline WL with the third via 136. The array of bitcells 200 may further include the third bitcell 100C, which may be embodied as a single bitcell that is programmed as logic zero (0) with the WL strap 106 coupled to the wordline WL with the third via 136. Further, the array of bitcells 200 may include the fourth bitcell 100D, which may be embodied as a single bitcell that is programmed as logic zero (0) without the WL strap 106 coupled to the wordline WL with the third via 136.

Figure 3:
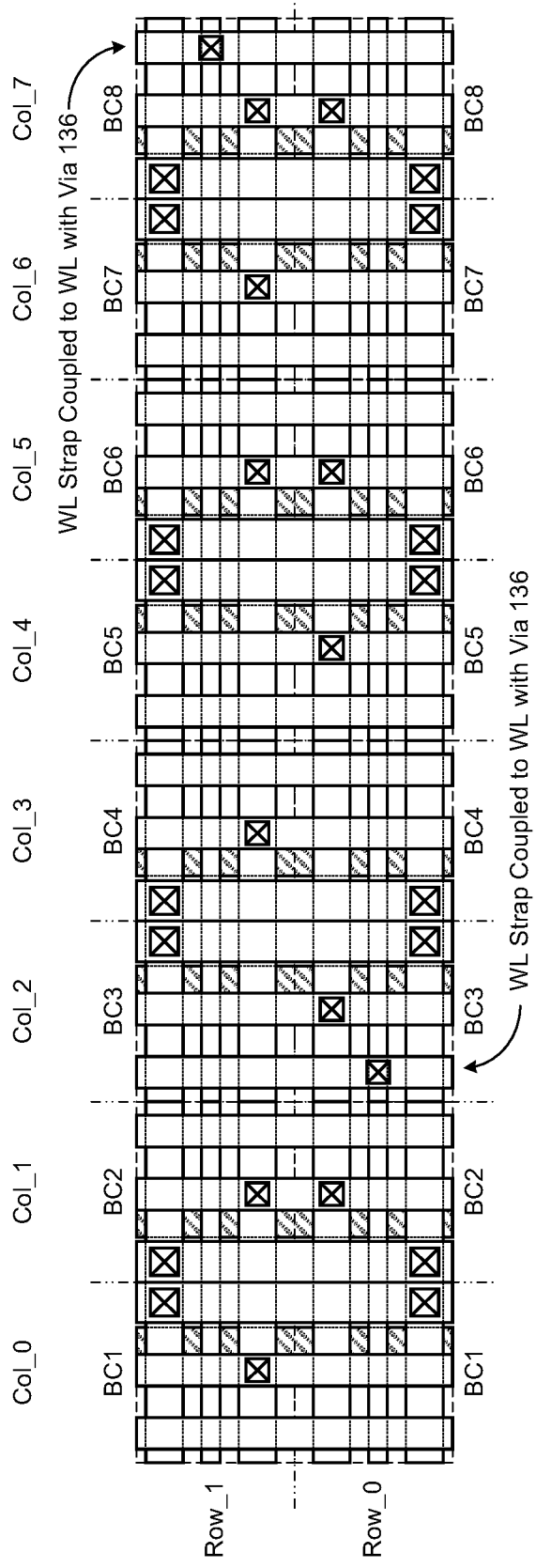
FIG. 3 illustrates a diagram of another array of bitcells in physical design in accordance with various implementations described herein.

FIG. 3 illustrates a diagram of another array of bitcells 300 in physical design in accordance with various implementations described herein.

As shown in FIG. 3, the array of bitcells 300 may be accessible via one or more bitlines BLs and one or more wordlines WLs, and the array of bitcells 300 may be grouped in sets of bitcells, such as, e.g., sets of eight (8) bitcells. Further, as shown, at least one bitcell in each set of bitcells may include a first strap that couples the at least one bitcell to ground (VSB, VSS, GND), a second strap that couples the at least one bitcell to at least one bitline BL of the one or more bitlines BLs, and a third strap that couples the at least one bitcell to at least one wordline WL of the one or more wordlines WLs within a boundary of the at least one bitcell.

The bitcells in the array of bitcells 300 may be arranged in columns (e.g., col_0, col_1, col_2, . . . , col_7) and rows (e.g., row_0, row_1, etc.). Further, each set of bitcells may include a set of multiple bitcells (e.g., eight (8) bitcells) in each row (e.g., row_0, row_1), and the at least one bitcell may be a single bitcell in each set of multiple bitcells. For instance, the sets of multiple bitcells may include a first set of eight (8) bitcells in row_0 and a second set of eight (8) bitcells in row_1). In this instance, each row of bitcells (e.g., row_0, row_1) may include a set of multiple bitcells, such as e.g., a set of eight (8) bitcells including BC1, BC2, BC3, . . . , BC8, that are arranged along each row of bitcells (e.g., row_0, row_1). Further, in this instance, the first set of eight (8) bitcells in row_0 may include a single bitcell (e.g., BC3) having the third strap coupled to the wordline WL, and the second set of eight (8) bitcells in row_1 may include a single bitcell (e.g., BC8) having the third strap coupled to the wordline WL. FIG. 3 shows eight (8) columns and two (2) rows; however, in various instances, any number of columns and any number of rows may be used and implemented in a similar manner as described herein in reference to the bitcells and the array of bitcells.

It should be appreciated that the sets of eight (8) bitcells shown in FIG. 3 represents one implementation of the present disclosure. In various other implementations, the set of multiple bitcells may include a set of multiple bitcells within a range of two (2) to thirty-two (32) bitcells, and the single bitcell is one (1) bitcell within the set of multiple bitcells within the range of two (2) to thirty-two (32) bitcells. Further, this idea may be implemented in sets of multiple bitcells having greater than thirty-two (32) bitcells. Still further, in various other implementations, the single bitcell within a set of multiple bitcells having the third strap coupled to the wordline WL may include multiple bitcells (i.e., more than one bitcell) within a set of multiple bitcells having the third strap coupled to the wordline WL. Thus, the various implementations described herein may be applied to various bitcell arrangements and/or configurations without departing from the various schemes and techniques described herein.

In some implementations, each bitcell in the array of bitcells is embodied with a read-only memory (ROM) bitcell. With reference to FIG. 3, the first strap may be a ground strap that couples the at least one bitcell to ground (VSB, VSS, GND) with a first via that is coupled to a first metal wire that is coupled to ground (VSB, VSS, GND). The second strap may be a bitline strap that couples the at least one bitcell to the at least one bitline BL of the one or more bitlines BLs with a second via that is coupled to a second metal wire that is coupled to the bitline BL. In some instances, the at least one bitcell (e.g., single bitcell having the third strap coupled to the wordline WL) in each set of bitcells may include the third strap (e.g., wordline strap) that couples the at least one bitcell to the at least one wordline WL of the one or more wordlines WLs with a third via that is coupled to a third metal wire that is coupled to the wordline WL.

In some implementations, the area of the array of bitcells may be decreased due to using the third strap to couple the at least one bitcell to the at least one wordline WL of the one or more wordlines WLs within the boundary of the at least one bitcell. This advantage and various other advantages may be achieved with use of the various schemes and techniques of the present disclosure.

Figure 4:
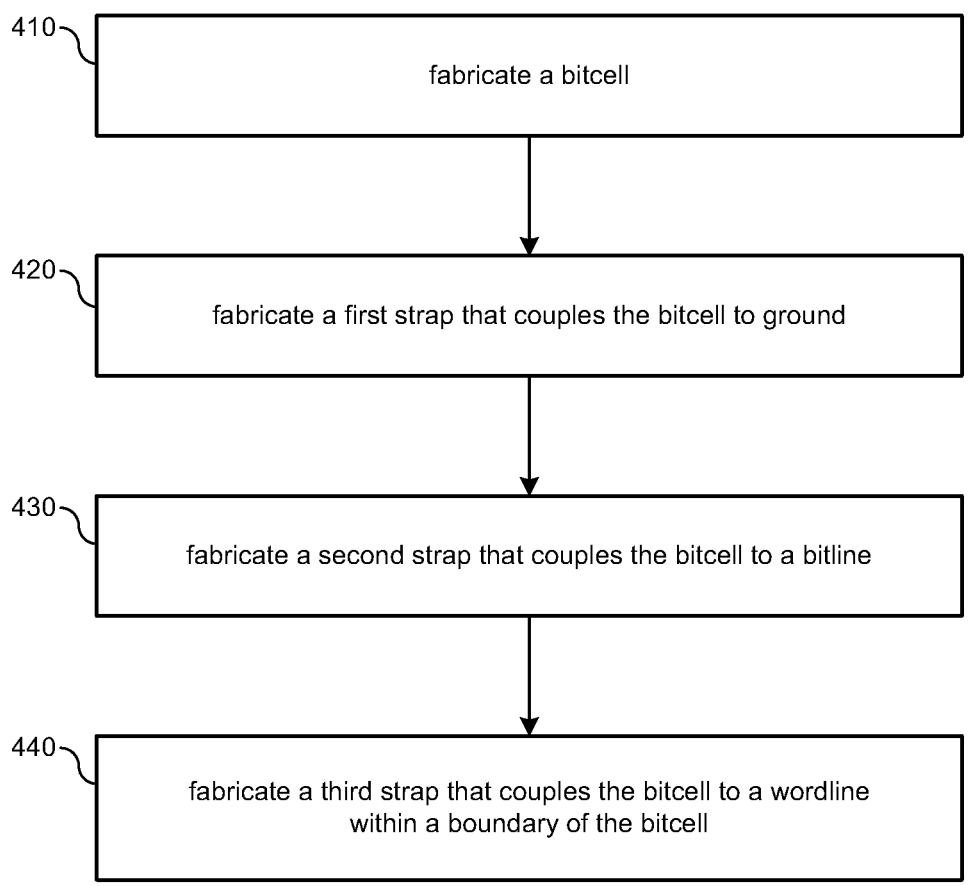
FIG. 4 illustrates a process flow diagram of a method for providing bitcell wordline strapping circuitry in physical design in accordance with various implementations described herein.

FIG. 4 illustrates a process flow diagram of a method 400 for providing bitcell wordline strapping circuitry in physical design for various memory applications in accordance with various implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Method 400 may be implemented in hardware and/or software. If implemented in hardware, method 400 may be implemented with various circuit components, such as described herein in reference to FIGS. 1-3. If implemented in software, method 400 may be implemented as a program or software instruction process that may be configured for fabricating bitcell wordline strapping circuitry in physical design as described herein. If implemented in software, instructions related to implementing the method 400 may be stored in memory and/or a database. For instance, a computer or various other types of computing devices having a processor and memory may be configured to perform method 400.

As described and shown in reference to FIG. 4, method 400 may be used for manufacturing an integrated circuit (IC) that implements bitcell wordline strapping circuitry in physical design for various types of memory applications.

At block 410, method 400 may include fabricating a memory cell (e.g., bitcell) having one or more internal circuit components within a boundary of the memory cell (e.g., bitcell). In some cases, the memory cell may be implemented as a bitcell, such as, e.g., a read-only memory (ROM) bitcell.

At block 420, method 400 may include fabricating a first strap (e.g., ground strap) that couples the memory cell (e.g., bitcell) to ground (VSB, VSS, GND). The first strap (e.g., ground strap) may be disposed within the boundary of the memory cell (e.g., bitcell). The first strap may be referred to as a ground strap that couples the bitcell to ground (VSB, VSS, GND) with a first via that is coupled to a first metal wire that is coupled to ground (VSB, VSS, GND).

At block 430, method 400 may include fabricating a second strap (e.g., bitline strap) that couples the memory cell (e.g., bitcell) to a bitline BL. The second strap (e.g., bitline strap) may be disposed within the boundary of the memory cell (e.g., bitcell). The second strap may be referred to as a bitline strap that couples the bitcell to the bitline BL with a second via that is coupled to a second metal wire that is coupled to the bitline BL. In various instances, coupling the second strap to the bitline BL may be used to program the bitcell to a logical state of one (1), and not coupling the second strap to the bitline BL may be used to program the bitcell to a logical state of zero (0).

At block 440, method 400 may include fabricating a third strap (e.g., wordline strap) that couples the memory cell (e.g., bitcell) to a wordline WL within a boundary of the memory cell (e.g., bitcell). The third strap may be referred to as a wordline strap that couples the bitcell to the wordline WL with a third via that is coupled to a third metal wire that is coupled to the wordline WL.

In some implementations, method 400 may refer to a method of fabricating a bitcell and/or an array of bitcells as part of an integrated circuit. One advantage to implementing method 400 may refer to a concept or associated idea where resistance of the bitcell is reduced due to using the third strap to couple the bitcell to the wordline WL within the boundary of the bitcell.

Figure 5:
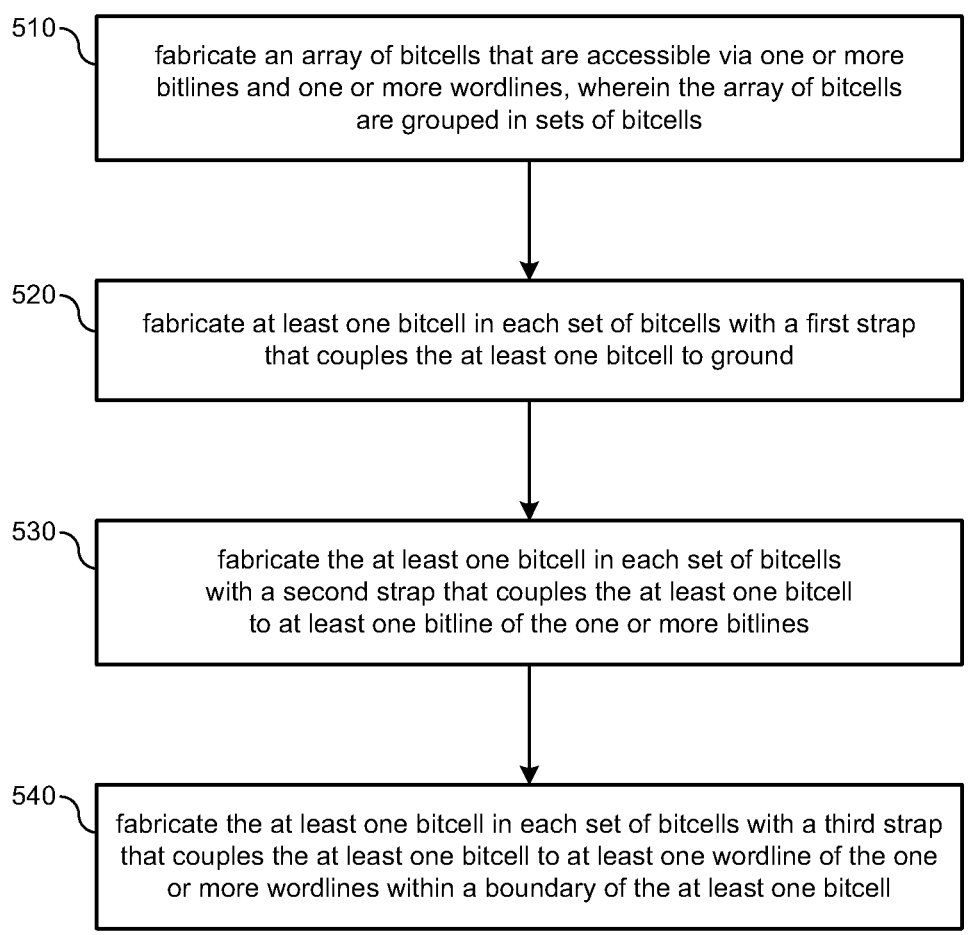
FIG. 5 illustrates a process flow diagram of another method for providing bitcell wordline strapping circuitry in physical design for various memory applications in accordance with various implementations described herein.

FIG. 5 illustrates a process flow diagram of another method 500 for providing bitcell wordline strapping circuitry in physical design for various memory applications in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Method 500 may be implemented in hardware and/or software. If implemented in hardware, method 500 may be implemented with various circuit components, such as described herein in reference to FIGS. 1-3. If implemented in software, method 500 may be implemented as a program or software instruction process that may be configured for fabricating bitcell wordline strapping circuitry in physical design as described herein. If implemented in software, instructions related to implementing the method 500 may be stored in memory and/or a database. For instance, a computer or various other types of computing devices having a processor and memory may be configured to perform method 500.

As described and shown in reference to FIG. 5, method 500 may be used for manufacturing an integrated circuit (IC) that implements bitcell wordline strapping circuitry in physical design for various types of memory applications.

At block 510, method 500 may include fabricating an array of bitcells that are accessible via one or more bitlines and one or more wordlines. The array of bitcells may be grouped in sets of bitcells. In some cases, each bitcell in the array of bitcells may be embodied as a read-only memory (ROM) bitcell. In some cases, the bitcells in the array of bitcells may be arranged in columns and rows. Further, each set of bitcells may include a set of multiple bitcells in each row.

In various implementations, the set of multiple bitcells may include a set of multiple bitcells within a range of two (2) to thirty-two (32) bitcells, and the single bitcell may be one (1) bitcell within the set of multiple bitcells within the range of two (2) to thirty-two (32) bitcells. In some implementations, the set of multiple bitcells may include a set of eight (8) bitcells (e.g., as shown in FIG. 3), and the single bitcell is one (1) bitcell within the set of eight (8) bitcells (e.g., as also shown in FIG. 3).

At block 520, method 500 may include fabricating at least one bitcell in each set of bitcells with a first strap that couples the at least one bitcell to ground (VSB, VSS, GND). As mentioned above, the first strap may be a ground strap that couples the at least one bitcell to ground with a first via that is coupled to a first metal wire that is coupled to ground (VSB, VSS, GND). Further, the at least one bitcell may include a single bitcell in each set of multiple bitcells.

At block 530, method 500 may include fabricating the at least one bitcell in each set of bitcells with a second strap that couples the at least one bitcell to at least one bitline of the one or more bitlines. As mentioned above, the second strap may be a bitline strap that couples the at least one bitcell to the at least one bitline of the one or more bitlines with a second via that is coupled to a second metal wire that is coupled to the bitline.

At block 540, method 500 may include fabricating the at least one bitcell in each set of bitcells with a third strap that couples the at least one bitcell to at least one wordline of the one or more wordlines within a boundary of the at least one bitcell. In some implementations, the third strap may be a wordline strap that couples the at least one bitcell to the at least one wordline of the one or more wordlines with a third via that is coupled to a third metal wire that is coupled to the wordline.

In various implementations, method 500 may refer to a method of fabricating a bitcell and/or an array of bitcells as part of an integrated circuit (IC). One advantage to implementing method 500 may refer to a concept or associated idea where an area of the array of bitcells is decreased due to using the third strap to couple the at least one bitcell to the at least one wordline of the one or more wordlines within the boundary of the at least one bitcell.

Various implementations described herein are directed to bitcell wordline strapping circuitry for reducing resistance and/or area in physical design for memory applications. Various advantages may be achieved with the schemes and techniques described herein. For instance, the described bitcell and wordline strapping within the bitcell provides area improvement. In another instance, the resistance of the described bitcell having the wordline strapping within the bitcell is reduced substantially so as to provide timing improvement. Further, in another instance, improvement in power slope of the wordline results in an improvement in dynamic power dissipation.

Described herein are various implementations of an integrated circuit. The integrated circuit may include a bitcell. The integrated circuit may include a first strap that couples the bitcell to ground. The integrated circuit may include a second strap that couples the bitcell to a bitline. The integrated circuit may include a third strap that couples the bitcell to a wordline within a boundary of the bitcell.

Described herein are various implementations of an integrated circuit. The integrated circuit may include an array of bitcells that are accessible via one or more bitlines and one or more wordlines. The array of bitcells may be grouped in sets of bitcells, and at least one bitcell in each set of bitcells include a first strap that couples the at least one bitcell to ground, a second strap that couples the at least one bitcell to at least one bitline of the one or more bitlines, and a third strap that couples the at least one bitcell to at least one wordline of the one or more wordlines within a boundary of the at least one bitcell.

Described herein are various implementations of a read-only memory (ROM) bitcell. The ROM bitcell may include a ground strap that couples the ROM bitcell to ground. The ROM bitcell may include a bitline strap that couples the ROM bitcell to a bitline. The ROM bitcell may include a wordline strap that couples the ROM bitcell to a wordline within a boundary of the ROM bitcell.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a bitcell;
   a first strap that couples the bitcell to ground;
   a second strap that couples the bitcell to a bitline with a second via; and
   a third strap that couples the bitcell to a wordline within a boundary of the bitcell,
   wherein the third strap couples the bitcell to the wordline with a third via, wherein the second and third vias are different, wherein the second and third vias are positioned within the boundary of the bitcell.

2. The integrated circuit of claim 1, wherein the bitcell comprises a read-only memory (ROM) bitcell.

3. The integrated circuit of claim 1, wherein the first strap comprises a ground strap that couples the bitcell to ground with a first via that is coupled to a first metal wire that is coupled to ground.

4. The integrated circuit of claim 1, wherein the second strap comprises a bitline strap that couples the bitcell to the bitline with the second via that is coupled to a second metal wire that is coupled to the bitline.

5. The integrated circuit of claim 4, wherein coupling the second strap to the bitline programs the bitcell to a logical state of one (1), and wherein not coupling the second strap to the bitline programs the bitcell to a logical state of zero (0).

6. The integrated circuit of claim 1, wherein the third strap comprises a wordline strap that couples the bitcell to the wordline with the third via that is coupled to a third metal wire that is coupled to the wordline.

7. The integrated circuit of claim 1, wherein resistance of the bitcell is reduced due to using the third strap to couple the bitcell to the wordline within the boundary of the bitcell.

8. An integrated circuit, comprising:
   an array of bitcells that are accessible via one or more bitlines and one or more wordlines, wherein the array of bitcells are grouped in sets of bitcells, and wherein at least one bitcell in each set of bitcells include:
   a first strap that couples the at least one bitcell to ground;
   a second strap that couples the at least one bitcell to at least one bitline of the one or more bitlines with a second via; and
   a third strap that couples the at least one bitcell to at least one wordline of the one or more wordlines within a boundary of the at least one bitcell,
   wherein the third strap couples the at least one bitcell to the at least one wordline with a third via, wherein the second and third vias are different, wherein the second and third vias are positioned within the boundary of the bitcell.

9. The integrated circuit of claim 8, wherein each bitcell in the array of bitcells comprises a read-only memory (ROM) bitcell.

10. The integrated circuit of claim 8, wherein the array of bitcells comprises multiple bitcells that are arranged in columns and rows, and wherein each set of bitcells comprises a set of multiple bitcells in each row, and wherein the at least one bitcell comprises a single bitcell in each set of multiple bitcells.

11. The integrated circuit of claim 10, wherein the set of multiple bitcells comprises a set of eight (8) bitcells, and wherein the single bitcell is one (1) bitcell within the set of eight (8) bitcells.

12. The integrated circuit of claim 10, wherein the set of multiple bitcells comprises a set of multiple bitcells within a range of two (2) to thirty-two (32) bitcells, and wherein the single bitcell is one (1) bitcell within the set of multiple bitcells within the range of two (2) to thirty-two (32) bitcells.

13. The integrated circuit of claim 8, wherein:

the first strap comprises a ground strap that couples the at least one bitcell to ground with a first via that is coupled to a first metal wire that is coupled to ground, the second strap comprises a bitline strap that couples the at least one bitcell to the at least one bitline of the one or more bitlines with the second via that is coupled to a second metal wire that is coupled to the bitline, and the third strap comprises a wordline strap that couples the at least one bitcell to the at least one wordline of the one or more wordlines with the third via that is coupled to a third metal wire that is coupled to the wordline.

14. The integrated circuit of claim 8, wherein area of the array of bitcells is decreased due to using the third strap to couple the at least one bitcell to the at least one wordline of the one or more wordlines within the boundary of the at least one bitcell.

15. A read-only memory (ROM) bitcell, comprising:
a ground strap that couples the ROM bitcell to ground;
a bitline strap that couples the ROM bitcell to a bitline with a second via; and
a wordline strap that couples the ROM bitcell to a wordline within a boundary of the ROM bitcell,
wherein the wordline strap couples the ROM bitcell to the wordline with a third via, wherein the second and third vias are different, wherein the second and third vias are positioned within the boundary of the bitcell.

16. The read-only memory (ROM) bitcell of claim 15, wherein the ground strap couples the ROM bitcell to ground with a first via that is coupled to a first metal wire that is coupled to ground.

17. The read-only memory (ROM) bitcell of claim 15, wherein the bitline strap couples the ROM bitcell to the bitline with the second via that is coupled to a second metal wire that is coupled to the bitline.

18. The read-only memory (ROM) bitcell of claim 17, wherein coupling the bitline strap to the bitline programs the ROM bitcell to a logical state of one (1), and wherein not coupling the bitline strap to the bitline programs the ROM bitcell to a logical state of zero (0).

19. The read-only memory (ROM) bitcell of claim 15, wherein the wordline strap couples the ROM bitcell to the wordline with the third via that is coupled to a third metal wire that is coupled to the wordline.

20. The read-only memory (ROM) bitcell of claim 15, wherein resistance of the ROM bitcell is reduced due to using the wordline strap to couple the ROM bitcell to the wordline within the boundary of the ROM bitcell.

* * * * *